United States Patent
Knudsen et al.

(10) Patent No.: US 8,866,661 B2
(45) Date of Patent: Oct. 21, 2014

(54) INPUT CONVERTER FOR AN EEG MONITORING SYSTEM, SIGNAL CONVERSION METHOD AND MONITORING SYSTEM

(75) Inventors: Niels Ole Knudsen, Humlebaek (DK); Soren Kilsgaard, Smorum (DK)

(73) Assignee: Widex A/S, Lynge (DK)

( * ) Notice: Subject to any disclaimer, the term of this patent is extended or adjusted under 35 U.S.C. 154(b) by 423 days.

(21) Appl. No.: 13/237,234

(22) Filed: Sep. 20, 2011

(65) Prior Publication Data

US 2012/0010522 A1    Jan. 12, 2012

Related U.S. Application Data (63) Continuation-in-part of application No. PCT/EP2009/055284, filed on Apr. 30, 2009.

(51) Int. Cl.
*H03M 1/12* (2006.01)
*H03M 3/00* (2006.01)
*H04R 25/00* (2006.01)
*H03M 1/00* (2006.01)

(52) U.S. Cl.
CPC ............... *H03M 3/486* (2013.01); *H03M 1/00* (2013.01); *H03M 3/43* (2013.01); *H03M 3/454* (2013.01); *H04R 25/505* (2013.01)
USPC .......................................... 341/156; 341/155

(58) Field of Classification Search
CPC ........ H03M 1/12; H03M 1/00; A61B 5/0476; A61B 5/0482; A61B 5/0488
USPC .................... 341/156, 155; 600/544, 545, 546
See application file for complete search history.

(56) References Cited

U.S. PATENT DOCUMENTS

| | | | |
|---|---|---|---|
| 6,037,887 A | 3/2000 | Wu et al. | |
| 6,441,747 B1 | 8/2002 | Khair et al. | |
| 7,224,203 B2 * | 5/2007 | Hazucha et al. | 327/337 |
| 2001/0044573 A1 * | 11/2001 | Manoli et al. | 600/383 |

(Continued)

FOREIGN PATENT DOCUMENTS

EP    1102405 A1    5/2011

OTHER PUBLICATIONS

International Search Report for PCT/EP2009/055284 dated Feb. 12, 2010.

(Continued)

*Primary Examiner* — Joseph Lauture
(74) *Attorney, Agent, or Firm* — Sughrue Mion, PLLC (57) ABSTRACT

In order to minimize noise and current consumption in an EEG monitoring system (40) which can be continuously carried by a person to be monitored, an input converter (44) for an EEG monitoring system is devised. The analog-to-digital converter of the input converter has an input stage, an output stage, and a feedback loop, and the input stage comprises an amplifier ($Q_A$) and an integrator (RLF). A voltage transformer (IT) is placed in the input converter upstream of input stage. The transformation ratio of the voltage transformer (IT) has a transformation ratio such that it provides an output voltage larger than the input voltage, thereby multiplying the signal voltage for the input stage by a fixed factor. The voltage transformer (IT) is a switched-capacitor voltage transformer having at least two capacitors ($C_x$, $C_y$, $C_z$). The invention further provides a method of converting an analog signal, and an EEG monitoring system comprising the input converter (44).

13 Claims, 6 Drawing Sheets

(56) References Cited

U.S. PATENT DOCUMENTS

| | | | |
|---|---|---|---|
| 2003/0117173 A1* | 6/2003 | Morgan | 326/86 |
| 2004/0004905 A1* | 1/2004 | Lyon et al. | 367/13 |
| 2007/0120715 A1 | 5/2007 | Zierhofer | |
| 2008/0291069 A1 | 11/2008 | Inukai et al. | |

OTHER PUBLICATIONS

Office Action for counterpart Chinese Application No. 200980159016.4 dated Jan. 3, 2014, with English translation.

* cited by examiner

INPUT CONVERTER FOR AN EEG MONITORING SYSTEM, SIGNAL CONVERSION METHOD AND MONITORING SYSTEM

RELATED APPLICATIONS

The present application is a continuation-in-part of application No. PCT/EP2009055284, filed on Apr. 30, 2009, in Europe and published as WO2010/124738 A1.

BACKGROUND OF THE INVENTION

1. Field of the Invention

The present invention relates to EEG monitoring systems. The invention, in particular relates to EEG monitoring systems, of the types which can be continuously carried by a person being monitored. More specifically, it relates to analog-to-digital input signal converters for signals from electrodes or transducers measuring EEG signals. The invention further relates to a method of converting an analog signal to a digital signal in an EEG monitoring system.

An analog-to-digital converter, denoted an A/D converter in the following, converts a varying current or voltage into a digital data format. Several different A/D converter topologies exist, each having benefits and tradeoffs in terms of conversion speed, accuracy, quantization noise, current consumption, word length, linearity and circuit complexity. In contemporary, digital hearing aid designs, the delta-sigma A/D converter type is the preferred converter type due to a number of important factors such as easy aliasing filter implementation, conversion noise being controllable by design, comparatively low power consumption and relatively easy implementation due to a low component count when compared to existing A/D converter designs.

By definition, noise inherent in a signal processing device is unwanted signals introduced by the signal processing device itself. Inherent noise may e.g. originate from inadequate operating conditions, poor design or variations in component values. These circumstances have to be taken into account in designing the signal processing device. In A/D converters, several different types of noise may be observed. Among these are conversion noise, quantization noise, thermal noise, flicker noise, recombination noise, and noise due to various physical limitations in the gain-producing elements. In order to provide a distinction between the sources of these different noise types, the most important noise types will be discussed briefly in the following.

Quantization noise originates from the process of quantifying a continuous input voltage span into a finite set of voltage levels that may be represented by discrete, binary levels according to the expression:

$$L_N = 2^n$$

where $L_N$ is the number of discrete levels possible and n is the number of bits used to represent a single sample in the digital domain. Quantization noise may be thought of as the difference between the actual input voltage of a single sample and the discrete voltage used to represent it. This type of noise may thus be minimized, e.g. by increasing the number of bits representing the signal arbitrarily, and will therefore not be discussed further here.

Thermal noise originates from the random Brownian motion of electrons in a resistive medium. Given a resistance, a bandwidth and a temperature, the rms thermal noise $V_{nt}$ is given by:

$$V_{nt} = \sqrt{4 k_b T \Delta f R}$$

where $k_b$ is Boltzmann's constant, $1{,}38065 \ast 10^{-23}$ J/K, T the absolute temperature in K, $\Delta f$ the bandwidth of interest in Hz and R the resistance in $\Omega$ of the circuit element considered. For a MOS semiconductor, thermal noise $E_n$ is given by:

$$E_n = \frac{8 \cdot k \cdot T}{3 \cdot \sqrt{2 \cdot K \cdot I_d \cdot \frac{W}{L}}}$$

where $I_d$ is the drain current, W is the physical width, and L is the physical length of the semiconductor element. A lower drain current will thus result in more input noise, but this is compensated by a higher signal level.

Flicker noise, or 1/f noise, is predominant in the noise spectrum at low frequencies. It has been observed in electronic devices since the era of vacuum tubes, and is also present in contemporary semiconductor devices. Since EEG signals typically are in the frequency range 0.1-100 Hz, it is important to limit 1/f noise as much as possible.

In order to provide an EEG monitoring system to be continuously carried by a person being monitored capable of working uninterrupted for several days without a need for replacing the battery, one design goal for the EEG monitoring system is that the current drawn from the battery by the electronic circuit is reduced as much as possible, preferably to a value below 1 mA. A semiconductor element providing amplification in the order of between one hundred times to perhaps a thousand times the signal present at its input uses a considerable percentage of this current as its bias current in order to handle the large gain within its operating limits.

In the case where the EEG monitoring system comprises two parts, e.g. an implantable part comprising electrodes and an external part comprising signal processing means and battery, the A/D converter will often be arranged with the electrodes in the implanted part. For this reason the power consumption of the A/D converter must be as low as possible. Often the internal implanted part will be prepared for receiving the necessary power from the external part. This could be achieved by the application of inductive means.

An EEG monitor adapted for being carried continuously by a person must be small and unobtrusive, and its power consumption has to be modest enough to allow for the use of light-weight batteries, which should be lasting at least a couple of days before needing replacement.

2. The Prior Art

Delta-sigma A/D converters are well known in the art. Their purpose is to convert a varying, analog input voltage into a binary bit stream for further processing in the digital domain. Delta-sigma A/D converters have significant advantages over other A/D converter designs. In order to reduce quantization noise introduced by the quantization stage (e.g. the comparator 3 shown in FIG. 1), oversampling and noise shaping is used. The oversampling and the delta-sigma modulator structure acts as a noise shaping filter, pushing the quantization noise from the frequency band of interest to higher frequencies as a consequence. Thereby a frequency band with a low noise figure is created for the signals of interest. A drawback is that the converter clock rate has to be higher than a traditional analog-to-digital converter operating at a sampling rate two times the highest frequency of interest, denoted the Nyquist limit. In delta-sigma converters oversampling ratios of 64 times to 128 times are often seen. However, this is a minor drawback in comparison with the advantages gained by the larger tolerance allowed for the values of the components in the converter.

In its essence, a delta-sigma A/D converter comprises a delta-sigma modulator and a low-pass filter. This may be made with an integrator, a comparator and a D-flip-flop. The output signal of the flip-flop is fed back through a feedback loop comprising a one-bit D/A converter, and is subtracted from the input signal upstream of the integrator. The subtracted feedback signal provides an error signal to the input of the delta-sigma modulator.

The error signal from the feedback loop of the A/D converter is used to ensure that, on average, the output signal level of the converter is always equal to the input signal level. If no signal is present on the converter input, a symmetric output bit stream of binary ones and zeroes is generated by the A/D converter. When the input signal voltage changes to a more positive voltage, more binary ones will be present in the output bit stream, and when the input signal voltage changes to a more negative voltage, more binary zeroes will be present in the output bit stream. The delta-sigma A/D converter thus converts an analog input signal into a balance between ones and zeroes in the output bit stream.

SUMMARY OF THE INVENTION

The invention, in a first aspect, provides an input converter for an EEG monitoring system, said input converter comprising a voltage transformer and an analog-to-digital converter of the delta-sigma type having an input stage and an output stage, a connection from the output of the input stage to the input of the output stage, and a feedback loop between the input of the input stage and the output of the output stage, said input stage comprising an amplifier and an integrator, wherein the voltage transformer has a transformation ratio such that it provides an output voltage larger than the input voltage and is placed in the input converter upstream of the input stage.

The invention, in a second aspect, provides a method of converting an analog signal into a digital signal in an EEG monitoring system comprising a digital signal processor, a sampling clock generator and a system clock generator, said method comprising the steps of transforming an input signal voltage into a higher voltage, amplifying the transformed input signal voltage, integrating the transformed, amplified voltage, digitizing the amplified, integrated voltage, subtracting the digitized voltage from the transformed input voltage, and using the digitized, integrated voltage for generating a digital output bit stream representing the input signal voltage to subsequent stages of the digital signal processor in the hearing aid.

The invention, in a third aspect, provides an EEG monitoring system for being carried continuously by a person to be monitored, said system comprising at least one electrode adapted for measuring one or more EEG signals from the person carrying the system; signal processing means for analyzing the EEG signal, adapted for, based on the EEG signal, identifying or predicting specific biological incidences in said person; an input converter adapted to convert an analog EEG signal from said electrode into a digital signal, said input converter having a voltage transformer, an input stage and an output stage, a connection from the output of the input stage to the input of the output stage, and a feedback loop between the input of the input stage and the output of the output stage, said input stage comprising an amplifier and an integrator, wherein the voltage transformer has a transformation ratio such that it provides an output voltage larger than the input voltage and is placed in the input converter upstream of the input stage.

In order to overcome the above shortcomings, the input converter according to the invention comprises a voltage transformer placed in the input converter upstream of the input stage and having a transformation ratio such that it provides an output voltage larger than the input voltage. When the input signal voltage is transformed up prior to being amplified by the amplifier stage, less amplification is needed in order to bring the input signal up to an acceptable level, and the relative amplifier noise contribution to the amplified signal is lower.

According to the invention, the input transformer is implemented as a voltage transformer. Voltage transformers are easily implemented in synchronized (clock-controlled) digital networks, and may be designed so as to optimize their impedance to the impedance of the amplifier and the subsequent stages of the A/D converter.

Further features and advantages are evident from the dependent claims.

BRIEF DESCRIPTION OF THE DRAWINGS

The invention will now be described in further detail with respect to the drawings, where.

DETAILED DESCRIPTION OF THE INVENTION

Figure 1:
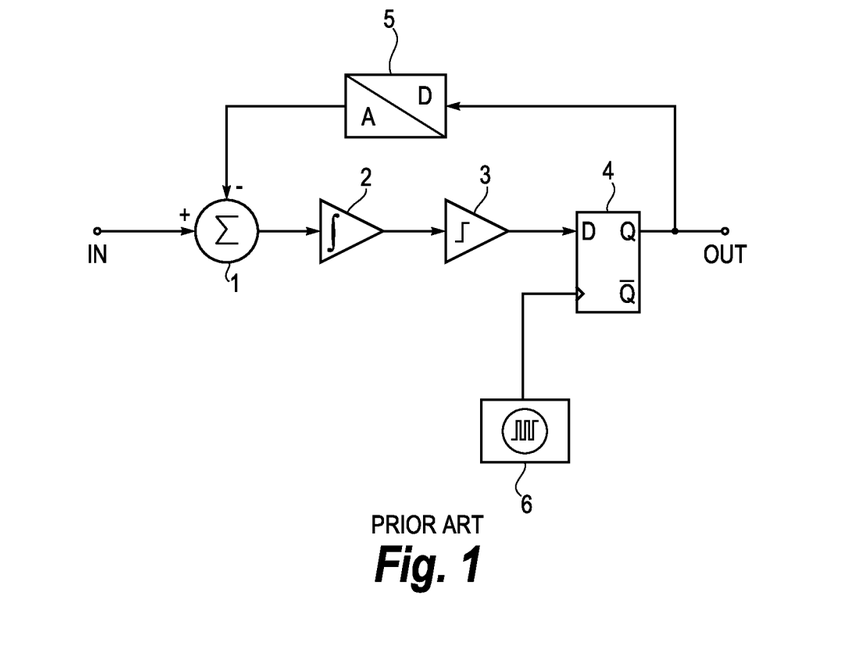
FIG. 1 is a schematic of a prior art delta-sigma A/D converter.

FIG. 1 shows a block schematic of a prior art delta-sigma A/D converter comprising an input terminal IN, a subtraction point 1, an integrator 2, a comparator 3, a D-flip-flop 4, a 1-bit digital-analog converter 5, a clock generator 6, and an output terminal OUT. An analog signal presented to the input terminal IN is fed to the subtraction point 1 where the output signal from the 1-bit D/A converter 5 is subtracted from the input signal, generating an error signal. The difference signal from the subtraction point 1 is fed to the input of the integrator 2 for generating an integral of the difference signal from the subtraction point 1. The output signal from the integrator 2 is presented to the input of the comparator 3 for generating a logical "one"-level whenever the integral signal exceeds a predetermined threshold limit set by the comparator 3, and a logical "zero"-level whenever the output signal from the integrator 2 falls below the predetermined threshold. This logical signal then feeds the data input of the flip-flop 4.

The clock generator 6 controls the flip-flop 4 in such a way that the output signal from the comparator 3 is quantized in time and synchronized to the clock signal, the flip-flop 4 working as a latch, thus creating a bit stream representing the input signal. The bit stream from the output of the flip-flop 4 is split between the output terminal OUT and the input of the 1-bit D/A converter 5 to the subtraction point 1 and subtracted from the input signal. The 1-bit D/A converter 5 converts the logical ones and zeroes in the bit stream into a positive or negative voltage with respect to the input signal for subtraction from the input signal in the subtraction point 1.

This arrangement, in essence, creates a feedback loop, making the bit stream represent the changes in the input signal over time, i.e. when the input signal level is zero, an equal number of digital ones and zeroes will be present in the bit stream; whenever the input signal goes positive, more ones than zeroes will be present in the bit stream in a proportion to the input signal level; and whenever the signal goes negative, more zeroes than ones will be present in the bit stream in a proportion to the input signal level. The bit stream may then be converted into a suitable, digital format for further processing in the digital domain.

A delta-sigma A/D converter design for an EEG monitoring system should have a small noise figure and a low current consumption. However, if the current consumption of the input amplifier of the A/D converter is decreased without any alterations to the design, the noise figure of the amplifier will increase correspondingly. This problem, and a possible solution, will be explained in further detail in the following.

Figure 2:
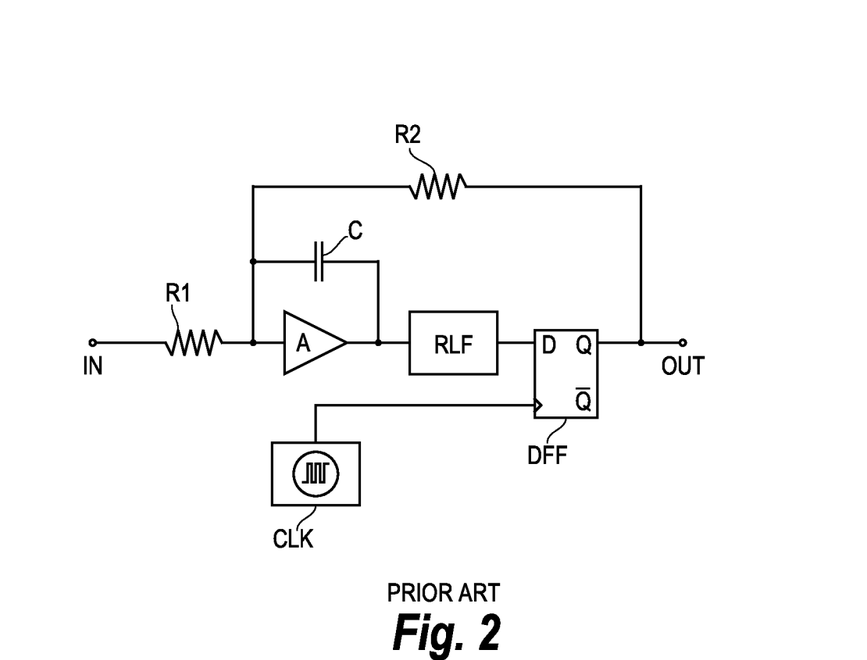
FIG. 2 is a more detailed schematic of the prior art delta-sigma converter in FIG. 1.

FIG. 2 shows a more detailed schematic of a prior art delta-sigma A/D converter. The converter comprises an input IN, a first resistor R1, a second resistor R2, an amplifier A, a capacitor C, a residual loop filter RLF, a D-flip-flop DFF, and a clock generator CLK generating a clock signal. The amplifier A and the capacitor C forms the integrator 2 of the converter topology shown in FIG. 1, and the residual loop filter RLF comprises subsequent low-pass filter stages present in second- or higher-order delta-sigma converters. The converter receives an analog input signal in the form of a voltage U at the input terminal IN and presents a bit stream representing a digital output signal Y at the output terminal OUT. It should be noted that the signals in the converter are time-continuous until the generation of the bit stream from the output Q of the flip-flop DFF.

The amplifier A and the residual loop filter RLF comprises the loop filter of the converter, and the frequency transfer function of the loop filter, i.e. the frequency transfer function of both A and RLF, determines the converter's ability to suppress frequency-dependent quantization noise. The gain of the amplifier A also suppresses the noise from the filter RLF because the filter RLF is positioned in the feedback loop of the converter. In this discussion, the reason for distinguishing between the amplifier loop filter, respectively, is to isolate the noise contribution from the amplifier A from other noise sources in the feedback loop. All other things being equal, the noise level of the amplifier A thus constitutes the main noise component of the converter apart from quantization noise. This is the reason that the contribution from this particular noise source should be minimized, as mentioned in the foregoing.

If the amplifier A were to have infinite gain, the signal level on the input terminal of the amplifier would be zero. Instead it may be assumed that the total gain of A and RLF combined is sufficiently large throughout the desired frequency bandwidth of the converter for the converter quantization noise to be neglected. Given an input voltage U and a resulting output voltage Y, the transfer function H of the complete converter in FIG. 2 in the ideal case may thus be estimated as:

$$H = \frac{Y}{U} = \frac{-R2}{R1}$$

In order to address the problem of the noise contribution from the input stage of the converter, this particular noise source has to be isolated. This is illustrated in the schematic in FIG. 3.

Figure 3:
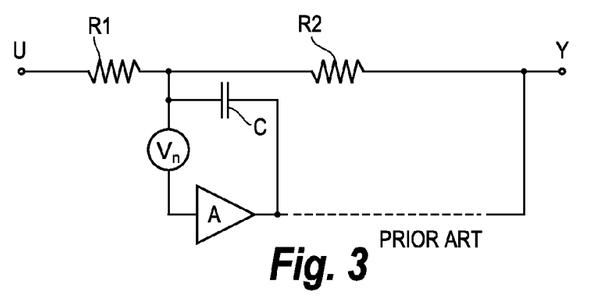
FIG. 3 is an equivalent schematic illustrating the noise level voltage $V_n$ of an amplifier of the delta-sigma converter in FIG. 2.

In FIG. 3, an ideal, noise-free amplifier A and a noise voltage source $V_n$ is substituting the amplifier A in FIG. 2, and the configuration of C, R1, R2 and A is sketched out together with the input voltage U, the output voltage Y, and the amplifier noise voltage source $V_n$, while the remaining components from FIG. 2 are left out from the schematic for clarity. If the total amplification from A and RLF (not shown in FIG. 3) is assumed to be sufficient for the desired bandwidth of the converter, the noise contribution $Y_n$ to the output voltage Y may be written as:

$$Y_n = \left(1 + \frac{R2}{R1}\right) \cdot V_n$$

The noise voltage contribution $U_n$ with reference to the input voltage U may then be calculated by combining the two expressions thus:

$$U_n = \frac{Y_n}{H} = -\left(1 + \frac{R1}{R2}\right) \cdot V_n$$

This implies that the input noise $U_n$ is dependent on the amplifier noise $V_n$. In other words, if it is possible to decrease $V_n$, the input noise $U_n$ will decrease, too.

The amplifier noise voltage $V_n$ has three primary origins. Noise due to the fact that the amplifier A has finite gain, intermodulation products originating from nonlinearities in the amplifier A, and thermal noise produced by the input stage of the amplifier A. Multi-stage amplifiers with large gain values have traditionally been used in order to minimize thermal noise. Likewise, noise may also be reduced by supplying the semiconductor elements in the amplifier with sufficiently large currents in order to keep the total noise in the output signal at an acceptable level.

However, none of these approaches are especially attractive in a converter design for an EEG monitoring system which can be continuously carried by a person being monitored, where current consumption and component count has to be kept to a minimum in order to prolong battery life. An alternative way of reducing the noise sensitivity of the amplifier in the converter is thus desired.

In theory, the noise voltage $V_n$ may be downscaled, e.g. by transforming the input signal U and the output signal Y by placing ideal transformers between the input terminal U and R1 and between the output terminal and R2 with a given transformation factor N.

Figure 4:
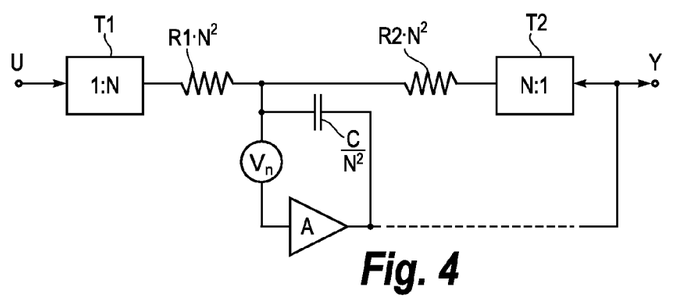
FIG. 4 is a schematic illustrating the principle of equivalent transformation of the input signal to the amplifier in FIG. 3.

FIG. 4 shows an equivalent schematic of the converter in FIG. 3, as modified by the incorporation of ideal transformers T1 and T2 in the input branch and the output branch of the converter, respectively. Both the input transformer T1 transforms the input voltage by the ratio 1:N, (i.e. the voltage on the transformer output is N times the voltage on the transformer input), and the feedback transformer T2 transforms the feedback voltage by the ratio 1:N (i.e. the voltage presented to the amplifier is N times the voltage present at the output node Y). The values of the resistors R1 and R2 are each scaled with a factor of $N^2$ in order to preserve the current load of the input and the output, respectively. Likewise, the value of the integrator capacitor C is scaled by the factor $N^{-2}$. It may be shown that the resulting amplifier noise voltage $V_n$ is scaled correspondingly by the factor $V_n/N$. In theory, it is possible to scale the noise contribution from the amplifier stage down by an arbitrary amount, providing the amplifier stage is capable of handling the increased input voltage without being saturated. The current demands for the converter are also smaller due to the impedance transformation.

Real transformers are non-ideal and therefore impossible to use in practical EEG monitoring system for continuous carrying by a person due to their size, weight, current consumption and power losses. The inventor has realized that the equivalent of an ideal transformer may be applied as a solution to the problem with satisfactory results. Such an equivalent is described in further detail in the following. The starting point of this discussion is a delta-sigma A/D converter utilizing a topology based on sampled capacitors. Sampled-capacitor stages are considered to be well-known in the art, and the working principle of such a sampled-capacitor A/D converter is described in further detail in the following with reference to FIG. 5 and FIG. 6.

Figure 5:
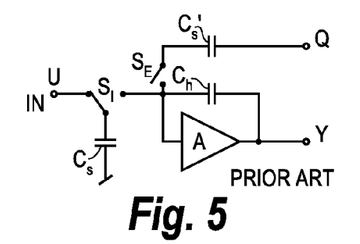
FIG. 5 is a schematic illustrating a first phase of a prior art sampled capacitor integrator.

FIG. 5 is a schematic illustrating a first phase of a sampling clock control signal in a prior art sampled-capacitor delta-sigma A/D converter comprising an input terminal U, a first sampling capacitor $C_s$, a first switch $S_I$, a second switch $S_E$, a hold capacitor $C_h$, an amplifier A, a feedback loop capacitor $C_s'$, a feedback loop terminal Q and an output terminal Y. The feedback loop terminal Q carries the feedback signal from the output of the D-flip-flop (not shown). The switches $S_I$ and $S_E$ are controlled by a sampling clock (not shown). In a first phase of the sampling clock control signal, shown in FIG. 5, the sampling capacitor $C_s$ is charged by the input voltage presented on the input terminal U during a first, specific period of time, via the switch $S_I$. The second switch $S_E$ is open in the first phase.

Figure 6:
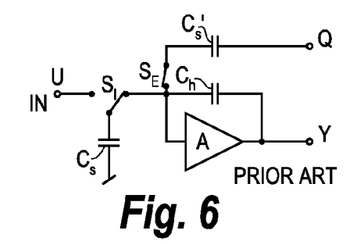
FIG. 6 is a schematic illustrating a second phase of a prior art sampled capacitor integrator.

In a second phase of the sampling clock control signal, shown in the schematic in FIG. 6, the switch $S_I$ disconnects the sampling capacitor $C_s$ from the input terminal U and connects it to the input of the amplifier A and the hold capacitor $C_h$, whereby the sampling capacitor $C_s$ is discharged for a second, specific period of time via the switch $S_I$, transferring its charge to the hold capacitor $C_h$. The switch $S_E$ is closed in the second phase, and connects the feedback loop capacitor $C_s'$ to the input of the amplifier A. The voltage on the input terminal of the amplifier A is now equal to the voltage on the input terminal U during the first period of time minus the error voltage present on the feedback terminal Q. When the second phase ends, the switches $S_I$ and $S_E$ are returned to their initial positions shown in FIG. 5, and the process is repeated periodically.

If the position of the switch S is controlled by a periodical signal having the frequency $f_s$, the impedance $Z_s$ of the sample capacitor $C_s$ may be described as:

$$Z_h = \frac{1}{(C_s \cdot f_s)}$$

Figure 7:
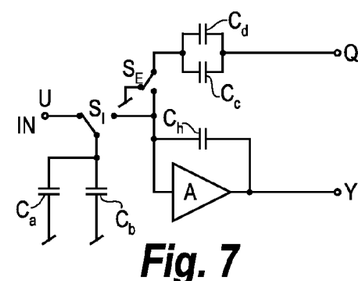
FIG. 7 is a schematic illustrating a first phase of the sampled capacitor integrator according to an embodiment of the invention.

Consider the sampling capacitor $C_s$ of the sampled-capacitor delta-sigma A/D converter in the first phase shown in FIG. 5 split into two capacitors, each having a capacitance of $C_s/2$. A voltage transformation may then be implemented by changing the sampled-capacitor design to look like the schematic in FIG. 7 and FIG. 8, respectively. The sampled-capacitor circuit design shown in FIG. 7 and FIG. 8 comprises two controlled switches $S_I$ and $S_E$, an amplifier A, a hold capacitor $C_h$, and four capacitors $C_a$ and $C_b$, $C_c$ and $C_d$, each of the four capacitors having a capacitance of $C_s/2$. In FIG. 7, the switch $S_I$ connects the two capacitors $C_a$ and $C_b$ to the input terminal IN in parallel in the first phase, in a manner similar to that shown in FIG. 5, and in FIG. 8, the switch $S_I$ connects the two capacitors $C_a$ and $C_b$ to the amplifier A in series in the second phase in a manner similar to that shown in FIG. 6.

Figure 8:
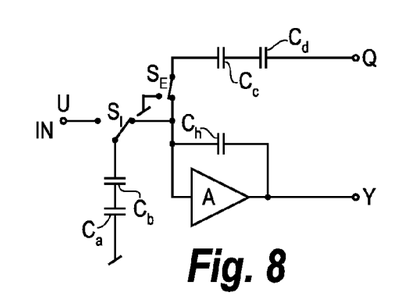
FIG. 8 is a schematic illustrating a second phase of the sampled capacitor integrator according to an embodiment of the invention.

Likewise, the feedback capacitors $C_c$ and $C_d$ are charged in parallel to the voltage present on the feedback loop terminal Q with reference to ground via the switch $S_E$ in the first phase in FIG. 7, and in the second phase, shown in FIG. 8, the feedback capacitors $C_c$ and $C_d$ are connected in series between the feedback loop terminal Q and the amplifier A via the switch $S_E$ during discharge of the feedback capacitors $C_c$ and $C_d$, whereby the voltage drop between the feedback loop terminal Q and the hold capacitor $C_h$ is doubled. The voltage present at the input of the amplifier A in the second phase is then $V_U - V_Q$, i.e. the doubled input voltage minus the doubled feedback voltage.

The effect of this arrangement is that the input node of the amplifier A is isolated from the input terminal U and the feedback loop terminal Q by the voltage transformers formed by the capacitors $C_a$, $C_b$, $C_c$ and $C_d$, respectively. The net result of doubling the input voltage and the feedback loop voltage is that the intrinsic noise level $V_n$ of the amplifier A becomes comparatively smaller, and the signal-to-noise ratio thus is improved, while maintaining both the input impedance and the output impedance of the amplifier stage A as seen from outside the circuit shown in FIG. 7 and FIG. 8, respectively.

With the capacitors $C_a$, $C_b$, $C_c$ and $C_d$ having values of $C_s/2$, respectively, this configuration is equivalent to a voltage transformation with a transformation factor of 1:2 for the input transformer, respectively 2:1 for the feedback transformer, as the impedance $Z_s$ of the hold capacitor $C_s$ now becomes:

$$Z_s = \frac{4}{(C_s \cdot f_s)}$$

This arrangement thus effectively quadruples the input impedance of the amplifier A. By changing the configuration of the circuit in synchronization with the two phases of the sampling clock frequency $f_s$ of the sampled-capacitor delta-sigma A/D converter, by means of the switches $S_I$ and $S_E$ as shown in FIGS. 7 and 8, the input voltage U presented to the input terminal of the amplifier A is then doubled to 2U.

Consider the amplifier A having unity gain, and an error signal of 0 V being present on the feedback loop terminal Q. Then the output signal downstream of the second voltage transformer $C_c$ and $C_d$ is:

$$\frac{2 \cdot U + V_n}{2} = U + \frac{V_n}{2}$$

This is based on the imperative that the capacitors $C_c$ and $C_d$ are shifted between the parallel configuration in the first phase shown in FIG. 7 and the serial configuration in the second phase shown in FIG. 8. By isolating the input of the amplifier A of the input stage of the A/D-converter from the rest of the circuitry with first and second voltage transformers in this way, an effective, comparative noise figure of $V_n/2$ may be obtained in a simple and effective manner.

Figure 9:
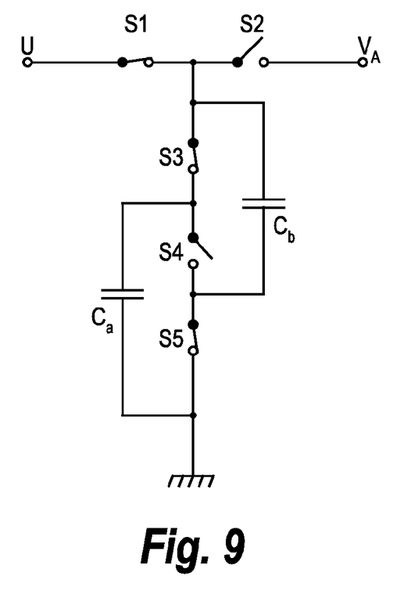
FIG. 9 is a schematic of an implementation of an input transformer in a first phase according to an embodiment of the invention.
Figure 10:
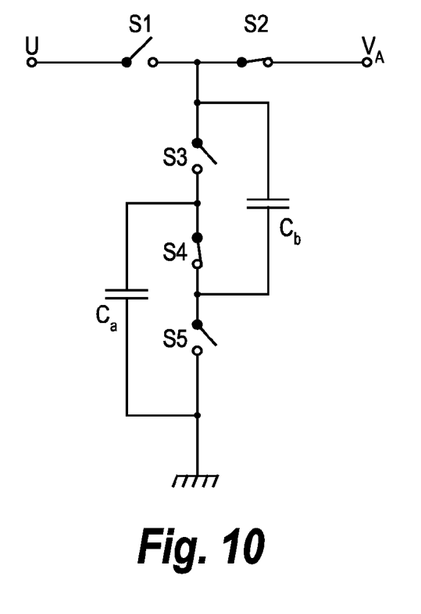
FIG. 10 is a schematic of an implementation of an input transformer in a second phase according to an embodiment of the invention.

A schematic illustrating a first and a second phase of the function of the input voltage transformer circuit of FIGS. 7 and 8 is described in the following with reference to FIG. 9 and FIG. 10. In FIG. 9 and FIG. 10, a voltage transformer circuit comprises an input terminal U, an output terminal $V_A$, five controlled switches S1, S2, S3, S4, and S5, and two sampling capacitors $C_a$ and $C_b$, both having a capacitance of $C_s/2$ with respect to the schematic of the circuit shown in FIGS. 5 and 6. The output terminal $V_A$ of the voltage transformer circuit is to be connected to an amplifier (not shown) as illustrated in FIGS. 7 and 8.

In the first phase of the voltage transformer, shown in FIG. 9, the switches S1, S3, and S5 are closed, and the switches S2 and S4 are open. The two capacitors are thus connected in parallel to the input terminal U in FIG. 9. A voltage present on the input terminal U will thus charge the capacitors $C_a$ and $C_b$ to the same voltage.

In the second phase of the voltage transformer, shown in FIG. 10, the switches S1, S3, and S5 are now open, and the switches S2 and S4 are now closed. The two capacitors $C_a$ and $C_b$ are now connected in series, thus doubling their total charge voltage while reducing the total capacitance to $C_s/4$, and connected to the output terminal $V_A$. The combined charge collected by the capacitors $C_a$ and $C_b$ is now presented as a voltage to the output terminal $V_A$. This voltage is double the voltage of U due to the altered configuration of the capacitors $C_a$ and $C_b$.

Consider the output terminal $V_A$ of the input voltage transformer shown in FIG. 9 and FIG. 10 connected to the input stage of an amplifier A in the way shown in FIG. 7 and FIG. 8. If the amplifier A has an amplification gain $\beta$, then the input voltage U is both doubled and multiplied by $\beta$, but the noise voltage $V_n$ is just multiplied by $\beta$. For a given input voltage U, the voltage output $V_Y$ from the amplifier A will be:

$$V_y = 2 \cdot \beta \cdot U + \beta \cdot V_n \Leftrightarrow V_Y = \beta(2 \cdot U + V_n)$$

The noise voltage contribution $V_n$ to the output voltage $V_Y$ is then half the noise voltage contribution of the untransformed input voltage in this case, provided that the amplifier is capable of handling the transformed input voltage of 2U.

The voltage contribution from the feedback loop signal of the delta-sigma A/D converter is doubled in a similar way by the second voltage transformer $C_c$ and $C_d$ as indicated in FIG. 7 and FIG. 8.

The principle of voltage transformation is extensible to an arbitrary number N of sampling capacitors each having the capacitance of $C_s/N$, in effect reducing the apparent noise figure of the amplifier equally to $V_n/N$. It is not essential for operation of the invention that the input transformer and the feedback transformer have the same transformation ratio. This principle permits implementation of the input amplifier in a much simpler way due to the reduced demands on its performance with regard to amplification gain, thermal noise, intermodulation noise, and errors due to finite gain of the amplifier.

The amplifier in the input stage of the A/D converter according to the invention may consequently be implemented as a simple, single-stage amplifier comprising one single semiconductor element, such as a BJT, FET, or other amplifying element having sufficient gain. Single-stage amplifiers inherently have a very attractive relationship between thermal voltage noise and current consumption. The voltage transformation further reduces the bias current demands of the amplifier and thus the current consumption of the complete A/D converter, of which the bias current for the input amplifier constitutes a substantial part.

Figure 11:
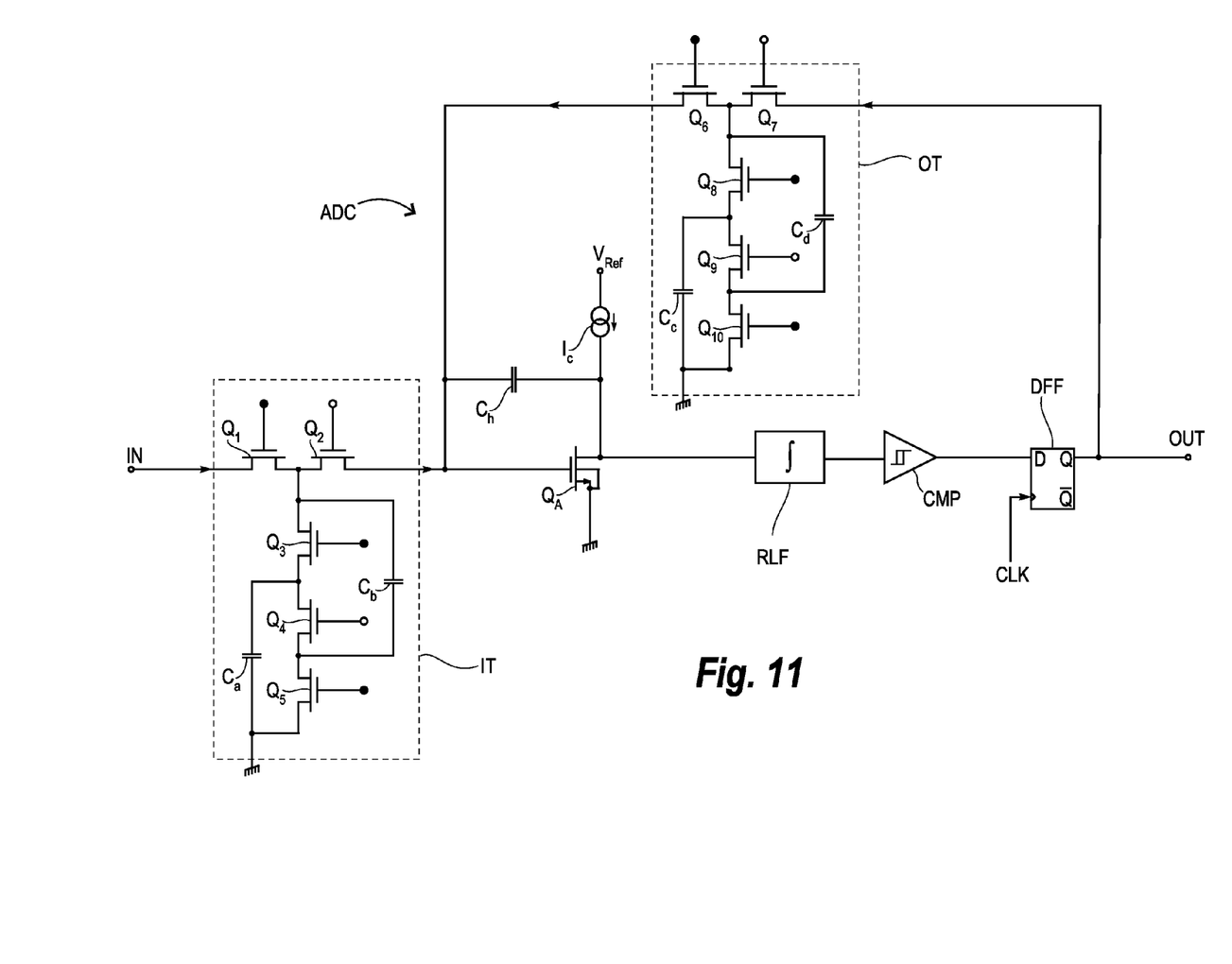
FIG. 11 is a schematic of a delta-sigma analog-to-digital converter according to an embodiment of the invention.

FIG. 11 shows a delta-sigma A/D converter ADC according to the invention. The A/D converter ADC comprises an input terminal IN, an input transformer stage IT, an amplifier stage $Q_A$, a hold capacitor $C_h$, a constant current generator $I_c$, a feedback transformer stage OT, a residual loop filter RLF, a comparator CMP, a flip-flop DFF, and an output terminal OUT. The flip-flop DFF is controlled by a system clock source (not shown). The amplifier stage $Q_A$ is fed a constant current from the constant current source $I_c$ powered by a connection to the reference voltage source $V_{ref}$. This current controls the operating point of the amplifier $Q_A$ in order for it to be able to provide the desired gain to the input signal.

The input transformer stage IT comprises switching transistors $Q_1$, $Q_2$, $Q_3$, $Q_4$, and $Q_5$, and capacitors $C_a$ and $C_b$. The feedback transformer stage OT comprises switching transistors $Q_6$, $Q_7$, $Q_8$, $Q_9$ and $Q_{10}$, and capacitors $C_c$ and $C_d$. For simplicity, these four capacitors are considered to be of equal capacitance, i.e. $C_a = C_b = C_c = C_d$.

The switching transistors $Q_1$, $Q_2$, $Q_3$, $Q_4$ and $Q_5$ of the input transformer stage IT are controlled by a sampling clock generator (not shown) in such a manner that when the signal edge of the sampling clock generator goes positive in a first phase, the switching transistors $Q_1$, $Q_3$, and $Q_5$ close (i.e. they allow an electrical current to pass), and $Q_2$ and $Q_4$ open (i.e. they block an electrical current). This is illustrated in FIG. 11 by an open or a filled circle, respectively, on the base terminal of the respective switching transistors. In the first phase of the signal edge of the sampling clock generator, a filled circle denotes a closed transistor and an open circle denotes an open transistor.

When the signal edge of the sampling clock generator goes negative in a second phase, the switching transistors $Q_1$, $Q_3$, and $Q_5$ of the input transformer IT open, and the switching transistors $Q_2$ and $Q_4$ close. In the second phase of the signal edge of the sampling clock generator, an open circle denotes a closed transistor and a filled circle denotes an open transistor. This configuration is equivalent to the schematics shown in FIGS. 9 and 10, respectively, where the transistors $Q_1$, $Q_2$, $Q_3$, $Q_4$, and $Q_5$ substitute the switches S1, S2, S3, S4, and S5, respectively, retaining the essential function of the circuit shown in FIGS. 9 and 10. The clock frequency of the sampling clock generator (not shown) is of the magnitude of 30 kHz, and the clock frequency of the system clock generator (not shown) is of the magnitude 1-2 MHz.

In the first phase, where $Q_1$, $Q_3$ and $Q_5$ are closed and $Q_2$ and $Q_4$ are open, the capacitors $C_a$ and $C_b$ are connected in parallel to the input terminal IN, and each capacitor is charged to the voltage present on the input terminal IN. In the second phase, where $Q_1$, $Q_3$ and $Q_5$ are open and $Q_2$ and $Q_4$ are closed, the capacitors $C_a$ and $C_b$ are connected in series to the input of $Q_4$, delivering their combined charge to the input of $Q_A$ and the hold capacitor $C_h$. Due to this arrangement, the input voltage fed to the input transformer IT will be doubled at its output, as explained above.

The switching transistors $Q_6$, $Q_7$, $Q_8$ $Q_9$ and $Q_{10}$ of the feedback transformer OT are also controlled by the sampling clock generator (not shown) in such a way that when the signal edge of the sampling clock generator goes positive in the first phase, the switching transistors $Q_6$, $Q_8$ and $Q_{10}$ close and $Q_7$ and $Q_9$ open. This is also illustrated by an open or a filled circle, respectively, on the base terminal of the respective switching transistors, where a filled circle denotes a closed transistor and an open circle denotes an open transistor. This implies that the capacitors $C_c$ and $C_d$ are connected in parallel to the input of the amplifier $Q_4$ in the first phase, delivering their combined charge to the input of the amplifier $Q_4$.

In the second phase, when the signal edge of the sampling clock generator goes negative, the switching transistors $Q_6$, $Q_8$ and $Q_{10}$ open, and $Q_7$ and $Q_9$ close. In this case, an open circle on the base terminal of the respective transistor denotes a closed transistor and a filled circle denotes an open transistor. This implies that the capacitors $C_c$ and $C_d$ are connected in series to the output terminal OUT in the second phase and charged by the error voltage from the flip-flop DFF. The capacitors $C_c$ and $C_d$ are essentially placed in the feedback loop of the amplifier $Q_4$, doubling the feedback voltage from the output of the flip-flop DFF before presenting the error voltage to the input of the amplifier $Q_4$.

The residual loop filter RLF outputs the integral of the signal from $Q_4$, and the comparator CMP outputs a logical zero value whenever the integral is below a predetermined threshold, and a logical one value whenever the integral is above a predetermined threshold. The flip-flop DFF converts the binary integral signal from the comparator CMP into a bit stream controlled by the clock signal CLK and fed to both the output terminal OUT and the input of the feedback transformer OT as a feedback signal.

By doubling the voltage present at the input of the amplifier $Q_4$ with the voltage transformers IT and OT respectively, the input voltage is increased by a factor two, and the relative noise voltage level $V_n$ is reduced as a consequence without the need for increasing the supply current to the amplifier $Q_4$.

The delta-sigma A/D converter according to the invention accomplishes two goals at the same time. Firstly, the single-stage input amplifier design implies that the current consumption of the input amplifier may be reduced considerably, and secondly, the signal-to-noise ratio is improved by transforming up the signal level before it reaches the input stage. The application of sample-clock controlled voltage transformers for isolating the input stage from the input and the error feedback loop, respectively, provides the solution to the signal-to-noise ratio problem arising from using a single-stage input amplifier without a significant increase in power consumption. This design is preferred in a battery-powered circuit such as an EEG monitoring system which can be continuously carried by a person being monitored, and as a result, more than one delta-sigma A/D converter may be implemented on the circuit chip comprising the main part of the electronic circuit of an EEG monitoring system.

Figures 12, 13, 14, 15:
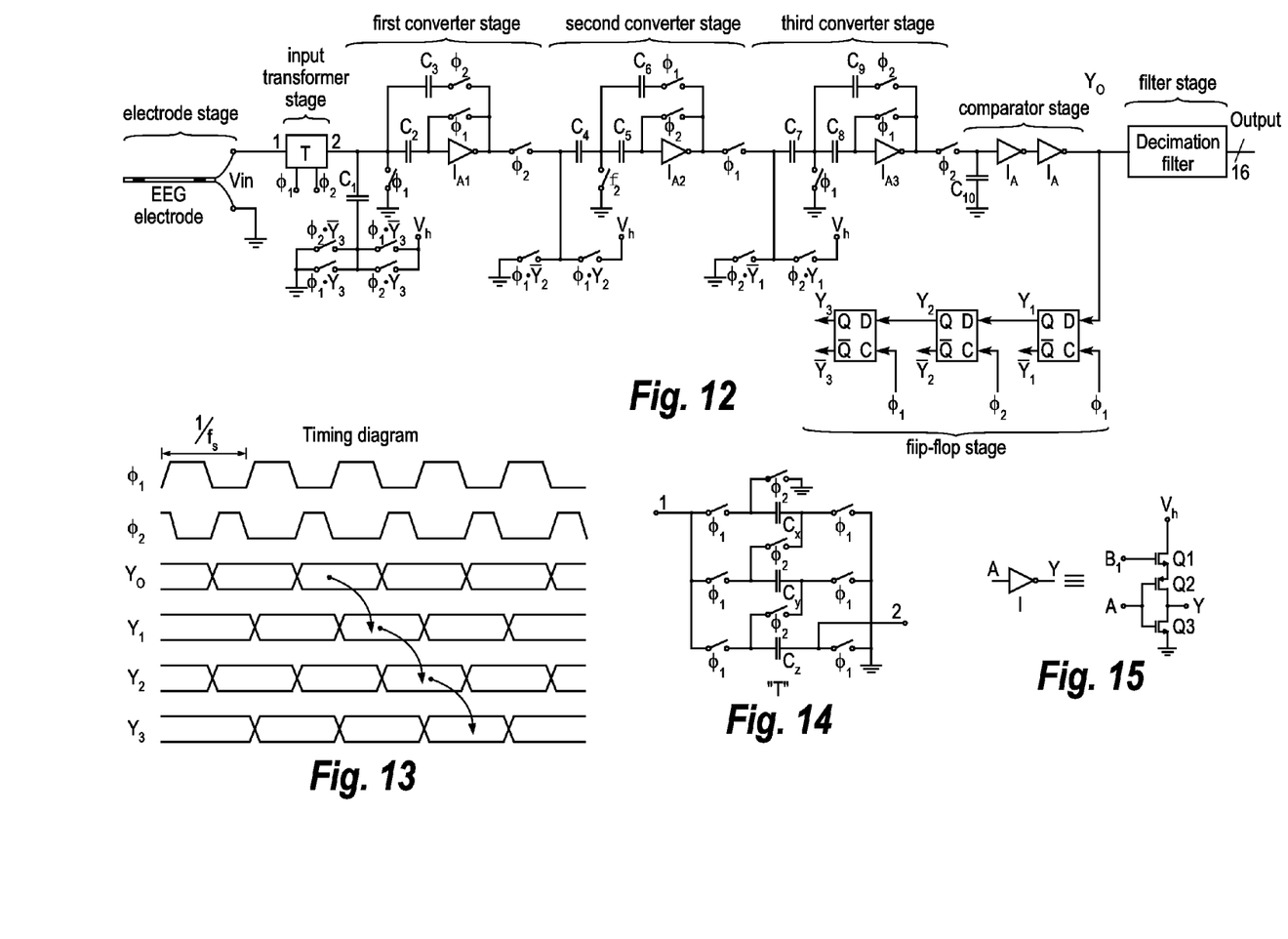
FIG. 12 is a schematic of a third-order delta-sigma A/D converter with a switched-capacitor input transformer according to an embodiment of the invention.
FIG. 13 is a timing diagram showing some of the most important signals in the delta-sigma A/D converter shown in FIG. 12.
FIG. 14 is a schematic showing a more detailed view of the input transformer T shown in FIG. 12.
FIG. 15 is an equivalent schematic showing an inverter amplifier I of the kind shown in FIG. 12.

The schematic in FIG. 12 shows a delta-sigma A/D converter according to the invention. The A/D converter comprises an input transformer stage, a first integrator stage, a second integrator stage, a third integrator stage, a comparator stage, a filter stage, and a flip-flop stage. Also shown in FIG. 12 is an EEG electrode stage comprising an EEG electrode and connecting wires connected to the input terminal of the input transformer stage. The EEG electrode does not form part of the converter itself, but generates the signals to be digitized by the converter, and the input impedance, sampling frequency and input voltage range of the converter is adapted to the signals from the EEG electrode.

The input transformer stage comprises an input transformer T having an input terminal 1 and an output terminal 2. The transformer T transforms the output voltage from the EEG electrode by a factor of 1:3, i.e. the voltage present on the output terminal 2 of the input transformer T is three times the voltage present on the input terminal 1 of the input transformer T. The input transformer T is configured as a triple switched-capacitor voltage transformer, and details of its operation is to be described later with respect to FIG. 14. The input transformer T is controlled by a first clock signal $\Phi_1$ and a second clock signal $\Phi_2$, respectively, in order to perform voltage transformation. The clock signals $\Phi_1$ and $\Phi_2$ are mutually exclusive. Furthermore, the input transformer T is configured in such a way that the output common mode voltage at the output terminal 2 is zero volts.

The first integrator stage comprises a first capacitor $C_1$, a second capacitor $C_2$, a third capacitor $C_3$, and an inverter amplifier $I_{A1}$. The second integrator stage comprises a first capacitor $C_4$, a second capacitor $C_5$, a third capacitor $C_6$, and a inverter amplifier $I_{A2}$. The third integrator stage comprises a first capacitor $C_7$, a second capacitor $C_8$, a third capacitor $C_9$, and a inverter amplifier $I_{A3}$. The purpose of the of the tree integrator stages is to form a noise shaping loop filter together with the feedback signals from the flip-flop stage and the switches. The coefficients in the loop filter are given by the capacitor ratios of $C_T/C_1$, $C_1/C_3$, $C_4/C_6$, $C_7/C_9$, where $C_T = C_x + C_y + C_z$ of the input transformer. The capacitors $C_2$, $C_5$ and $C_8$ are used for storage of the amplifier offset voltage used to eliminate DC and to reduce the 1/f noise in the converter. This technique is also known as correlated double sampling.

The comparator stage comprises a tenth capacitor $C_{10}$, a fourth inverter amplifier $I_{A4}$, and a fifth inverter amplifier $I_{A5}$. The purpose of the comparator stage is to condition and digitize the output signal from the chain of integrator stages into a bit stream suitable for further processing by the decimation filter and the flip-flop stage.

The flip-flop stage comprises a first, edge-triggered D-flip-flop $FF_1$ for generating the output signals $Y_1$ and $\overline{Y}_1$ from the output signal from the comparator stage and the first clock signal $\Phi_1$, a second, edge-triggered D-flip-flop $FF_2$ for generating the output signals $Y_2$ and $\overline{Y}_2$ from the output signal from the first, edge-triggered D-flip-flop $FF_1$ and the second clock signal $\Phi_2$, and a third, edge-triggered D-flip-flop $FF_3$ for generating the output signals $Y_3$ and $\overline{Y}_3$ from the output signal from the second, edge-triggered D-flip-flop $FF_2$ and the first clock signal $\Phi_1$. The first flip-flop $FF_1$ feeds the output signal $Y_1$ to the input of the second flip-flop $FF_2$, The second flip-flop $FF_2$ feeds the output signal $Y_2$ to the input of the third flip-flop $FF_3$, and the third flip-flop $FF_3$ feeds the output signal $Y_3$ and $\overline{Y}_3$ to the relevant switch control inputs of the first integrator stage.

The output signals $Y_1$, $Y_2$, $Y_3$, $\overline{Y}_1$, $\overline{Y}_2$, and $\overline{Y}_3$ are used as conditional feedback signals for regulating the signal flow in the first, second and third integrator stages, respectively. The clock signals $\Phi_1$ or $\Phi_2$ are mutually exclusive, and the output signals $Y_1$ and $\overline{Y}_1$, $Y_2$ and $\overline{Y}_2$, $Y_3$ and $\overline{Y}_3$ from the first, the second and the third edge-triggered D-flip-flops are also mutually exclusive. The manner in which the output signals from the flip-flop stage regulates the signal flow in the first, the second and the third integrator stages will be described in the following.

The first node of the first capacitor $C_1$ in the first integrator stage is connected to four, mutually exclusive controlled switches. When $\Phi_1$ and $Y_3$ is high, or $\Phi_2$ and $\overline{Y}_3$ is high, the first node of the first capacitor $C_1$ is connected to ground, and when $\Phi_1$ and $\overline{Y}_3$ is high, or $\Phi_2$ and $Y_3$ is high, the first node of the first capacitor $C_1$ is connected to $V_h$. Thus, the first node of the first capacitor $C_1$ may be connected to ground or $V_h$, respectively, dependent on the control signals.

The second node of the first capacitor $C_1$ is connected to the output of the voltage transformer T, the first node of the second capacitor $C_2$ and the first node of the third capacitor $C_3$ forming a first input node. Furthermore, the first input node is connected to ground whenever $\Phi_1$ is high.

The second node of the second capacitor $C_2$ is connected to the input of the first inverter amplifier $I_{A1}$. Whenever $\Phi_1$ is high, the first inverter amplifier IA1 is short-circuited. Whenever $\Phi_2$ is high, the second node of the third capacitor $C_3$ is connected to the output of the first inverter amplifier $I_{A1}$ and to the input of the second integrator stage, forming a second input node. Whenever $\Phi_2$ is not high, no connection between the first and the second integrator stage exists.

The first node of the fourth capacitor $C_4$ is connected to two mutually exclusive controlled switches. When $\Phi_1$ and $\overline{Y}_2$ is high, the first node of the fourth capacitor $C_4$ is connected to ground, and when $\Phi_1$ and $Y_2$ is high, the first node of the fourth capacitor $C_4$ is connected to $V_h$. The first node of the fourth capacitor $C_4$ is also connected to the second input node, receiving the output signal from the first integrator stage.

The second node of the fourth capacitor $C_4$ is connected to the first node of the fifth capacitor $C_5$ and the first node of the sixth capacitor $C_6$. The second node of the fourth capacitor $C_4$ is also connected to ground whenever $\Phi_2$ is high. The second node of the fifth capacitor $C_5$ is connected to the input of the second inverter amplifier $I_{A2}$, and the second inverter amplifier $I_{A2}$ is short-circuited whenever $\Phi_2$ is high. Whenever $\Phi_1$ is high, the second node of the sixth capacitor $C_6$ is connected to the output of the second inverter amplifier $I_{A2}$ and the input of the third integrator stage, forming a third input node.

The first node of the seventh capacitor $C_7$ is connected to two mutually exclusive controlled switches. When $\Phi_2$ and $\overline{Y}_1$ is high, the first node of the seventh capacitor $C_7$ is connected to ground, and when $\Phi_2$ and $Y_1$ is high, the first node of the seventh capacitor $C_7$ is connected to $V_h$. The first node of the seventh capacitor $C_4$ is also connected to the third input node, receiving the output signal from the second integrator stage.

The second node of the seventh capacitor $C_7$ is connected to the first node of the eighth capacitor $C_8$ and the first node of the ninth capacitor $C_9$. The second node of the seventh capacitor $C_7$ is also connected to ground whenever $\Phi_1$ is high. The second node of the eighth capacitor $C_8$ is connected to the input of the third inverter amplifier $I_{A3}$, and the third inverter amplifier $I_{A3}$ is short-circuited whenever $\Phi_1$ is high. Whenever $\Phi_2$ is high, the second node of the ninth capacitor $C_9$ is connected to the output of the third inverter amplifier $I_{A3}$ and the input of the comparator stage.

The comparator stage receives the output signal from the third integrator stage and generates a bit stream suitable for processing by the decimation filter. The bit stream is also fed back to the first, the second and the third integrator stages, respectively, through the flip-flop stage for controlling the operation of the individual integrator stages with respect to the input signal from the electrode.

The decimation filter generates an output of a plurality of individual, digital signals (sixteen signal lines are indicated in FIG. 12) from the input bit stream. These digital signals form sets of digital words, representing the sampled, digitized signal from the input electrode, suitable for encoding for electromagnetic transmission and further processing by a digital signal processor (not shown).

The A/D converter according to the invention is configured specifically for converting EEG voltage signals with a bandwidth from between 0.1 Hz to approximately 40 Hz and a signal value of up to 0.1 volts RMS. Thus, if a sampling frequency of 32 kHz and an oversampling ratio of 128 is selected, the effective bandwidth of the A/D converter becomes:

$$\text{Bandwidth} = \frac{1}{2}\left(\frac{32 \text{ kHz}}{128}\right) = 125 \text{ Hz}$$

which is more than adequate for the current purpose. The A/D converter has a noise floor below 1 $\mu V_{rms}$ over the effective bandwidth from 0.1 Hz to 40 Hz, and is designed to be operating at a supply voltage of 0.9 volts. In the internal part of the EEG monitoring system, this supply voltage is provided by a communications coil generating an induction current from a varying electromagnetic field generated by a corresponding communications coil placed in an external part of the EEG monitoring system, and a capacitor for storing the energy for use by the electronic circuit.

The timing diagram shown in FIG. 13 illustrates six cardinal signals in the delta-sigma A/D converter according to the invention. Seen from the top down in FIG. 13, the first graph represents the first sampling clock signal $\Phi_1$ having a period of $1/f_s$, where $f_s$ is the sampling frequency. The second graph from the top in FIG. 13 represents the second clock signal $\Phi_2$, also having a period of $1/f_s$, but being reversed in phase with respect to the first clock signal $\Phi_1$. In order to not having $\Phi_1$ and $\Phi_2$ change state at the same time, a non-overlapping clock scheme is used. This means that $\Phi_1$ and $\Phi_2$ will never be high at the same time.

The third graph from the top in FIG. 13 is the output signal $Y_0$ from the comparator stage. This signal represents the bit stream as fed to the decimation filter. The fourth graph represents the output signal $Y_1$ from the first flip-flop FF1. This signal is equal to the signal $Y_0$ delayed by half a clock pulse, and is used to control the third integrator stage in the manner described earlier. The fifth graph represents the output signal $Y_2$ from the first flip-flop FF1. This signal is equal to the signal $Y_1$ delayed by half a clock pulse, and is used to control the second integrator stage in the manner described earlier. The sixth graph represents the output signal $Y_3$ from the first flip-flop FF1. This signal is equal to the signal $Y_2$ delayed by half a clock pulse, and is used to as feedback to the third integrator stage in the manner described earlier.

The third-order delta-sigma A/D converter according to the invention is configured to sample, noise-shape and digitize the input signal from the electrode as shown in FIG. 12. As the signals from the electrode are very weak, some form of amplification is desired before the signal is digitized. In order to keep power requirements of the electrode and the A/D converter to a minimum, a voltage transformer T is used to increase the signal level available to the A/D converter. In the embodiment shown, a voltage transformer having a transform ratio of 1:3 is used.

A voltage transformer T configured for use in the A/D converter according to the invention is shown in FIG. 14. The voltage transformer T comprises an input terminal 1, a first capacitor $C_x$, a second capacitor $C_y$, a third capacitor $C_z$, a set of controlled switches for regulating the signal flow through the voltage transformer T, and an output terminal 2. The switches in the voltage transformer T are controlled by the first clock signal $\Phi_1$ and the second clock signal $\Phi_2$, respectively. The clock signals $\Phi_1$ and $\Phi_2$ are changing with the frequency of the sample rate, as described earlier. Each switch is closed when the respective clock signal is high, and open when the respective clock signal is not high, in the same manner as shown in FIG. 12.

When the first clock signal $\Phi_1$ is high, the first nodes of each of the capacitors $C_x$, $C_y$ and $C_z$ are all connected to the input terminal 1, the second nodes of each of the capacitors $C_x$, $C_y$ and $C_z$ are all connected to ground. Thus, the voltage present on the input terminal 1 charges the capacitors $C_x$, $C_y$ and $C_z$ to the same voltage.

When the second clock signal $\Phi_2$ is high, the first node of the first capacitor $C_x$ is connected to ground, the second node of the first capacitor $C_x$ is connected to the first node of the second capacitor $C_y$, the second node of the second capacitor $C_y$ is connected to the first node of the third capacitor $C_z$, and the second node of the third capacitor $C_z$ is connected to the output terminal 2. The voltage charges of the now serially connected capacitors $C_x$, $C_y$ and $C_z$ are thus combined to a single voltage equaling three times the input voltage. When the first clock signal $\Phi_1$ is high again, the process is repeated. In this way, the voltage present on the input terminal 1 is effectively tripled before being presented to the first integrator stage.

In FIG. 15 is shown an equivalent schematic of a generic inverter amplifier I of the kind shown in FIG. 12. Inverters are frequently used in digital circuits, having the virtue of inverting or negating the logical value presented to the input. Inverters are usually made from complementary metal oxide semiconductor field effect transistor (MOSFET) elements operating in saturation mode.

However, an inverter may be regarded as a single stage inverting amplifier with an input offset. The input offset is about half the supply voltage. The output of the inverter amplifier is in fact a push-pull amplifier stage. Such an amplifier stage is very effective in switched-capacitor systems. The reason is that the transconductance ($I_{out}/V_{in}$) of a NMOS/PMOS push-pull amplifier stage follows a quadratic function for both positive and negative input signals, which is not the case of a traditional class-A output stage, where the quadratic function only exists for either the positive or the negative input. The low power requirement is of paramount importance in an EEG monitoring system to be worn continuously.

If a stable bias voltage is supplied, the inverter will give adequate amplification for a lot of circuit applications, including the A/D converter of the invention, due to the noise and power considerations discussed elsewhere in the application.

Given an inherent amplification gain $\beta$, the output voltage $V_o$ of an inverter amplifier is:

$$V_o = -\beta \cdot V_{in}$$

where $V_{in}$ is the input voltage. Using standard technology, amplification gain values of around 150 times may be easily accomplished in this way.

The inverter amplifier I shown in FIG. 15 comprises a first NMOS transistor $Q_1$, an PMOS transistor $Q_2$, and a second NMOS transistor $Q_3$. A supply voltage source $V_h$ is connected to the source of the first NMOS transistor $Q_1$, a bias voltage source $B_1$, having a voltage value larger than $V_h$, is connected to the gate of the first NMOS transistor $Q_1$, the source of the first NMOS transistor $Q_1$ is connected to the source of the PMOS transistor $Q_2$, an input terminal A is connected to the gate terminals of the PMOS transistor $Q_2$ and the second NMOS transistor $Q_3$, respectively, the drain of the PMOS transistor $Q_2$ and the drain of the second NMOS transistor $Q_3$ is connected to an output terminal Y, and the source of the second NMOS transistor $Q_3$ is connected to ground.

When a positive signal voltage is applied to the input A of the inverter amplifier I, the output voltage Y goes negative, and when a negative signal voltage is applied to the input A, the output voltage Y goes positive. In this way, the inverter operates as an inverting amplifier with a sufficient linearity and distortion figure for use in the A/D converter according to the invention.

Figure 16:
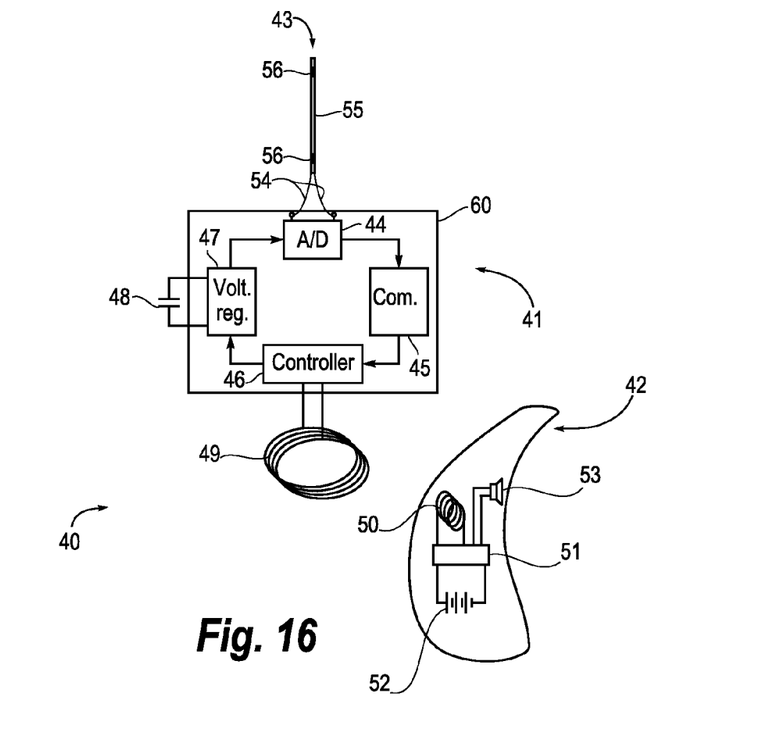
FIG. 16 is a block schematic showing an EEG monitoring system having an implantable part and an external part.

FIG. 16 shows an EEG monitoring system 40 comprising an implantable part 41 and an external part 42. The implantable part 41, suitable for being subcutaneously positioned behind the ear of a person in need of EEG monitoring, comprises a subcutaneous EEG electrode 43 having a plurality of active areas 56 separated by isolators 55, said electrode 43 being connected to an electronic circuit 60. The EEG electrode 43 shown in this embodiment has three active areas 56, but other embodiments may require an EEG electrode having only two active areas. The electronic circuit 60 comprises an A/D converter 44 according to the invention, a data packet controller 45, a communications controller 46, and a voltage regulator 47. The electrode 43 is connected to the input terminals of the A/D converter 44 via electrode wires 54, the communications controller 46 is connected to a first communications coil 49, and the voltage regulator 47 is connected to a ceramic capacitor 48. The external part 42 of the EEG monitoring system 40 comprises a controller 51 connected to a second communications coil 50, a battery 52 for powering the controller 51, and a loudspeaker 53 for providing an acoustic signal, e.g. an alarm in the event of a seizure coming up.

When in use, the external part 42 of the EEG monitoring system 40 may be placed behind the ear of a user for whom monitoring of an EEG signal is desired, and in the vicinity of the subcutaneously implantable part 41, said implantable part 41 being implanted right below the skin and slightly behind the ear of the user and positioned in such a way that a reliable, electrical EEG signal may be detected by the electrode 43.

The electrode 43 picks up EEG signals as a varying electrical voltage potential from two of the active areas 56 and feeds the varying electrical voltage to the input terminals of the A/D converter 44 via the electrode wires 54. The A/D converter 44 converts the varying electrical voltage from the electrode 43 into a digital signal and presents said digital signal to the data packet controller 45. The data packet controller 45 arranges the digital signal representing the electrical signal from the electrode 43 into a stream of data packets according to a predetermined communications protocol, and feeds the resulting stream of data packets to the communications controller 46.

The communications controller 46 is configured to alternate between two operational states. The first state of the communications controller 46 enables the electronic circuit 60 to be energized electromagnetically by receiving energy from the second communications coil 50 of the external part 42 by the first communications coil 49. The electromagnetic energy received in the first communications coil 49 is transferred by the communications controller 46 to the voltage regulator 47 and stored briefly as a voltage charge in the ceramic capacitor 48. The electrical energy stored in the ceramic capacitor 48 is then used as a power source for the electrical circuit 60.

The second state of the communications controller 46 takes data packets representing the electrical EEG signals from the electrode 43 from the data packet controller 45 and converts them in the first communications coil 49 into bursts of electromagnetic energy suitable for being received and detected by the second communications coil 50 of the external part 42. The second communications coil 50 converts the received bursts of electromagnetic energy into an electrical signal suitable for being continuously decoded and analyzed by the controller 51.

Depending on the results of the analysis of the EEG signals, decisions may be taken by the controller 51 to activate the loudspeaker 53 sounding an alarm, e.g. when a predetermined medical condition is deemed to be present from the analysis of the EEG signals. This alarm may then alert a user to the medical condition, and allow him or her to take adequate steps to alleviate the medical condition, e.g. by taking a prescription drug or consulting medical personnel to ask for immediate advice or help, depending on the medical condition.

Figure 17:
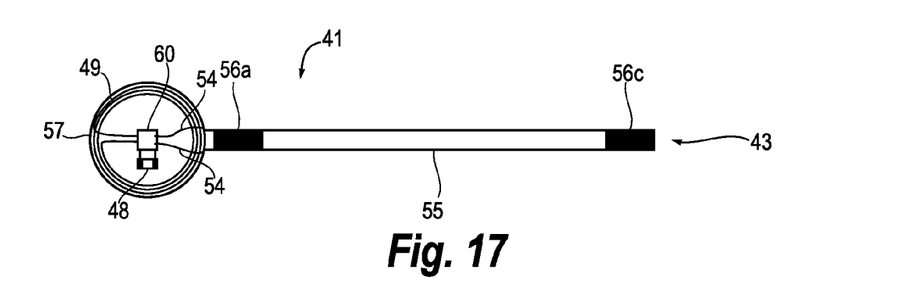
FIG. 17 is a top view of an implantable part of an EEG monitoring system.
Figure 18:
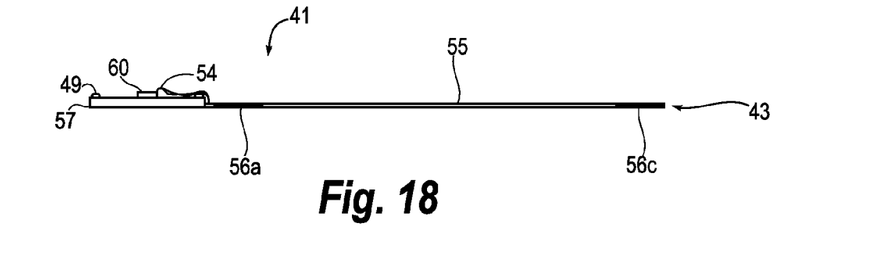
FIG. 18 is a side view of the implantable part of an EEG monitoring system, as shown in FIG. 16.

FIGS. 17 and 18 shows an implantable part 41 of the EEG monitoring system 40 shown in FIG. 16. FIG. 17 shows a top view of the implantable part 41, and FIG. 18 shows a corresponding side view of the implantable part 41. The implantable part 41 comprises an EEG electrode 43 having isolated areas 55, active areas 56a, 56c for contacting subcutaneous tissue in order to detect the presence of an electrical signal, and a substantially circular carrier element 57 comprising an electronic circuit 60, a ceramic capacitor 48, and a first communication coil 49. The implantable part 41 is configured for subcutaneous implantation behind the ear of a user, and the EEG electrode 43 is embodied as an elongated member having a physical length of about 60 mm and a physical width of approximately 1 mm, and the substantially circular carrier element 57 has a diameter of approximately 20 mm in order to make the EEG electrode easily implantable.

The EEG electrode is arranged to be implanted subcutaneously behind the ear of a user in order to provide a signal suitable for detection by the electronics of the internal part of the EEG monitoring system. A typical output signal from the EEG electrode has a magnitude in the range of approximately 1 µV to 100 mV. Muscular contractions usually generate voltage levels of a magnitude of 10 mV, but such signals are filtered out by the system. The intrinsic noise level of the electrode is about 1 µV RMS measured over a bandwidth from 0.1 to 100 Hz, and the useable bandwidth of the output signal is 0.1 to 40 Hz. The electrode has a bio-compatible PTFE polymer base, and the electrode contacts are made from a, likewise bio-compatible, platinum-iridium-alloy [Pt—Ir] with 90% platinum and 10% iridium.

Prior to implantation, the implantable part 41 is encased completely in a bio-compatible resin (not shown) but for the electrode 43 in order to protect the electronic circuitry from the environment of the surrounding tissue posterior to implantation. When the external part 42 is worn behind the ear where the implant has been positioned, the second communications coil 50 of the external part will be less than one cm from the first communications coil 49 of the implantable part 41, thus facilitating communication between the implantable part 41 and the external part 42 of the EEG monitoring system 40. This communication includes the external part 42 delivering electromagnetic energy to the implantable part 41, and the implantable part 41 transmitting data representing signals from the electrode 43 to the external part 42 for analysis.

We claim:

1. An input converter for an EEG monitoring system, said input converter comprising a switched capacitor voltage transformer and an analog-to-digital converter of the delta-sigma type having an input stage and an output stage, a connection from the output of the input stage to the input of the output stage, and a feedback loop between the input of the input stage and the output of the output stage, said input stage comprising an amplifier and an integrator, wherein the voltage transformer has a transformation ratio such that it provides an output voltage larger than its input voltage and is placed in the input converter upstream of the input stage.

2. The input converter according to claim 1, characterized in that the voltage transformer comprises at least two capacitors arranged to be charged in a parallel configuration by said input voltage and to be discharged in a serial configuration, delivering said output voltage, and means for controlling the charging and discharging of the capacitors in the respective configurations.

3. The input converter according to claim 2, characterized in that the voltage transformer is controlled by a sampling clock generator.

4. The input converter according to claim 3, characterized in that the voltage transformer is controlled by a system clock generator.

5. The input converter according to claim 1, characterized in that the amplifier comprises a single amplifying semiconductor element.

6. The input converter according to claim 5, characterized in that the amplifier comprises a buffer inverter as the amplifying element.

7. The input converter according to claim 1, characterized in that the output voltage of the voltage transformer is larger than the respective input voltage.

8. An EEG monitoring system comprising an input converter according to claim 1.

9. The input converter according to claim 1, wherein said switched capacitor transformer is configured to receive its input voltage from an EEG electrode stage.

10. An input converter for an EEG monitoring system, said input converter comprising a voltage transformer and an analog-to-digital converter of the delta-sigma type having an input stage and an output stage, a connection from the output of the input stage to the input of the output stage, and a feedback loop between the input of the input stage and the output of the output stage, said input stage comprising an amplifier and an integrator, wherein the voltage transformer is configured to receive its input voltage from an EEG electrode stage and has a transformation ratio such that it provides an output voltage larger than its input voltage and is placed in the input converter upstream of the input stage.

11. The input converter according to claim 10, characterized in that the amplifier comprises a single amplifying semiconductor element.

12. The input converter according to claim 11, characterized in that the amplifier comprises a buffer inverter as the amplifying element.

13. An EEG monitoring system comprising an input converter according to claim 10.

* * * * *